May 17, 1960 R. P. SEVEN ET AL 2,937,085

COMPOSITE PHOTOSENSITIVE PLATE, AND METHOD OF MAKING PRINTING PLATE THEREFROM

Filed Jan. 11, 1954

INVENTORS
RAYMOND P. SEVEN
JAMES J. MIYASHIRO

BY Zabel, Baker, York, Jones + Dithmar

ATTORNEYS 2,937,085
Patented May 17, 1960

2,937,085

COMPOSITE PHOTOSENSITIVE PLATE, AND METHOD OF MAKING PRINTING PLATE THEREFROM

Raymond P. Seven, Delavan, and James J. Miyashiro, Lake Geneva, Wis., assignors to Ditto, Incorporated, a corporation of Delaware Application January 11, 1954, Serial No. 403,266

5 Claims. (Cl. 96—33)

The invention relates to composite photosensitive plates, and methods of making printing plates therefrom.

In its preferred embodiment, the invention relates to photosensitive plates which, when exposed to light, under a positive transparency and treated with an aqueous solution, produce a photolithographic printing plate that gives a positive print. Such printing plates are known as autopositive photolithographic printing plates. The invention also includes a method of preparing such printing plates.

It is known in the photolithographic art how to produce photosensitive layers which can be converted to lithographic printing surfaces after suitable exposure to light and subsequent chemical and/or mechanical treatment. In general, these photosensitive layers, deposited on suitable supports, are such that exposure to light through a pattern followed by the necessary subsequent treatment, renders some portions of the surface receptive to greasy ink and other portions repellent to greasy ink in a direct pattern or in a reversed pattern as compared with the original. Such surfaces can then be used in lithographic duplicating devices for printing of positive or reversed copies of the original transparent or translucent pattern used in the exposure.

Subsequently, in this application, the word "hydrophilic" will be interpreted to mean a surface which is preferentially wet by water when in contact with water and greasy ink as in a typical lithographic printing system, and the word "oleophilic" will be interpreted to mean a surface which is preferentially wet by greasy ink under the same conditions.

As a common lithographic practice, photosensitive layers of lithographic plates are made by incorporation of dichromate salts or diazonium compounds of high molecular weight, for example, the products of condensation of formaldehyde and paradiazodiphenylamine sulfate, in layers of certain colloids such as gelatin, albumen, regenerated cellulose, produced, for example, by the superficial saponification of a cellulose ester film, or numerous other polymeric colloids. The incorporation of the sensitizing component, for example, ammonium dichromate or diazonium compound, is accomplished by dissolving the two components together in a coating composition or by soaking or coating or tinting a film of the colloidal material with a solution containing the dichromate or the diazonium compounds. In most cases the colloids used are water soluble materials, such that exposure to light in the presence of the light sensitive materials mentioned causes the colloids to be tanned, that is, insolubilized. This tanned material is oleophilic and can be used as the printing portion of a lithographic plate.

Attempts have been made to utilize such photosensitive layers to produce autopositive photolithographic printing plates which can be used to make replicate copies of a given positive transparent pattern or translucent pattern. One of these attempts is the deep-etch method of lithographic platemaking which is well known to those skilled in the art. Preparation of these plates for lithographic use, however, involves a tedious procedure consisting, among other things, of washing, etching, lacquering, scrubbing, and gumming. Suitable printed copy can be made from such a plate only when it is prepared by the hand of one especially skilled in the trade. Other closely related processes are the glue process and the gelatin process for autopositive platemaking. Each of these likewise requires tedious procedures for preparing the plates for press use.

An object of this invention is to provide a composite photosensitive plate having a photosensitive layer strongly bonded to a base layer and which remains strongly bonded to the base layer on exposure to light, those portions not being exposed to light being readily removable by treatment with water.

Another object is to provide a composite photosensitive plate suitable for producing intaglio and typographic printing plates.

Another object of this invention is to provide a composite photosensitive plate suitable for producing autopositive photolithographic printing plates.

Another object of this invention is to provide a simple, inexpensive and efficient, autopositive photolithographic printing plate which, after manufacture, can be prepared for use on an offset lithographic press by a single exposure and a single, simple developing technique.

Another object, is to provide, for use on this printing plate, a photosensitive composition which is water soluble when not exposed to light, but which becomes efficiently insolubilized and yet remains hydrophilic when exposed to light.

Other objects and advantages of the invention will become apparent as the following description progresses, reference being made to the accompanying drawing. These drawings are not included to convey in any way the relative size of the plate components but are merely included to portray more vividly the function of each component.

Figure 1:
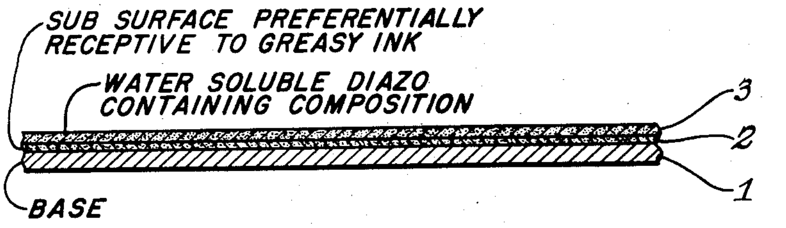
Fig. 1 is a view in diagrammatic sectional elevation showing a photolithographic printing plate of this invention.
Figure 2:
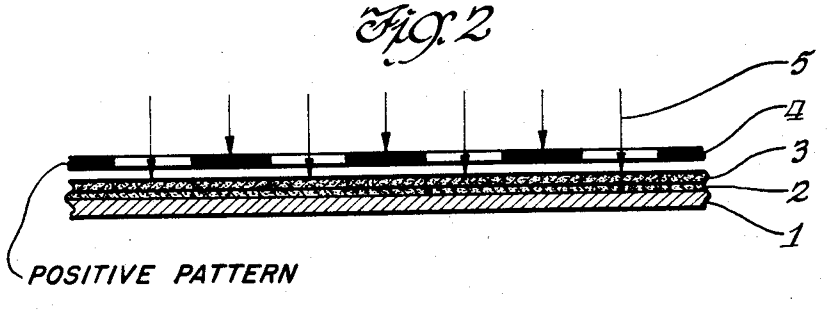
Fig. 2 is a view in diagrammatic sectional elevation showing the printing plate of Fig. 1 being exposed to light through a positive pattern.

Referring to Fig. 1 of the drawings, in which a preferred embodiment of the invention is illustrated, a base sheet 1 is coated with a coating 2 which is, or can be made, water insoluble and oleophilic. Coating 2 may be omitted if the surface of base sheet 1 is oleophilic. Layer 3 is an adherent coating of a water soluble composition which upon light exposure becomes water insoluble but remains hydrophilic, and in addition, remains or becomes well bonded to layer 2 (or base sheet 1 if layer 2 is omitted).

Figure 3:
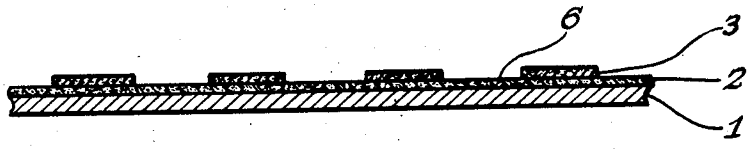
Fig. 3 is a view in diagrammatic sectional elevation showing the photolithographic printing plate after being exposed to light as in Fig. 2 and treated with water to dissolve the water soluble portions which were not exposed to light.

After exposure of the plate to light and removal of pattern 4, the plate is treated with water or a suitable aqueous solution to dissolve the water soluble, unexposed portions, producing a printing plate as shown in Fig. 3. The portions of layer 3 which have been insolubilized by exposure to light remain as part of the printing plate and provide hydrophilic areas on the plate. Portions of the plate where layer 3 has been washed off are now oleophilic. When this plate is wet with water or lithographic fountain solutions, the hydrophilic portions will not accept greasy inks, whereas the available portions of layer 2 (or base sheet 1 if layer 2 is omitted) accept the ink in preference to water. There are thus obtained printing portions corresponding to the opaque portions of the positive pattern 4 and non-printing portions corresponding to the transparent portions of the positive pattern 4. The plate may thus be employed as the printing medium in a printing machine operating on lithographic principles. The plate will print positive copies of the original pattern.

A more detailed description of the composition of matter useful in the various layers of the plate follows herewith.

In the general description of the perferred embodiment of the autopositive printing plate as just presented, base sheet 1 is a sheet made of a material which retains its strength when wet and remains dimensionally stable throughout its use on a printing press. Examples of such materials are metals, e.g. aluminum, zinc. steel; plastics, e.g. polyesters of glycols and terephthalic acid; cellulose esters, polyamides; or various resin filled or treated papers. These materials may be chemically or mechanically treated to provide an improved bond to layer 2.

Layer 2 in the attached drawing is an oleophilic, water-insoluble material supported on and bonded to base sheet 1. The preferred materials for this layer are oleophilic materials used in the lithographic arts, e.g., chromate tanned colloids or the light- or heat-decomposition products of high molecular weight diazonium salts, diazosulfonates, diazoamino compounds or azides, alone or with a colloid. The colloids may be tanned by mixing with light sensitive diazonium compounds or chromate, followed by exposure to light, heat, or a combination of light and heat. Preferably the light should be predominantly light in the range of 3000 to 5000 angstrom units. Specifically preferred is a layer of the condensation product of formaldehyde and paradiazo-diphenylamine sulfate or chloride coated from a dilute aqueous solution and decomposed by exposure to light, heat, or both light and heat. It is emphasized that this decomposition may be readily accomplished in the manufacturing process and is not required in the procedure for the preparation of the plate for press use. This material, and other condensation products of aldehydes with aromatic diazonium compounds, as disclosed in Schmidt and Zahn Patent 2,063,631, are preferred because of their excellent oleophilic properties following decomposition and because these decomposition products are evenly coatable by the aqueous solutions used to apply the preferred components of layer 3, and because such layers so prepared bond well to each other.

Layer 3 is a layer of a water-soluble composition which, upon light exposure, becomes water insoluble and well bonded to layer 2 (or base sheet 1 if layer 2 is omitted), and yet remains hydrophilic. A further requirement of layer 3 is that it have a sensitivity such that light passing through the transparent portions of the positive pattern used in the exposure accomplishes its intended purpose of insolubilizing the layers, but that traces of light which may leak through the image areas of the positive pattern are insufficient to accomplish this same effect. It is an object of this invention to show that these characteristics can be accomplished well by including a water soluble colloid and a light sensitive compound in this layer such that exposure to light causes insolubilization of the colloid without making the colloid oleophilic. It is a further object of this invention to show that these requisites can be met only by proper choice of colloid and sensitizer and by careful choice of the ratio of these two components. If the ratio of sensitizer to colloid is too high, the exposure to light may render the colloid oleophilic, or the leakage of light through the image areas of the positive pattern may be sufficient to cause insolubilization of the colloid where it is not desired.

The colloid component of layer 3 can be any water-soluble, water-swellable, or hydrophilic colloid including one of the following, or a mixture of the following: a vegetable gum such as gum arabic, locust bean gum, pectin, alginic acid, and its sodium or ammonium salt, or its propylene glycol ester; a cellulose ether such as methylcellulose, beta-hydroxy-ethyl-cellulose, beta-hydroxypropylcellulose, or sodium carboxymethylcellulose; other polycarbohydrates of plant or animal origin such as starch, glycogen, dextrans, levans; proteins such as albumen or gelatin; synthetic polymeric water-soluble colloids such as polyacrylic acid, its sodium salt or etheylene glycol ester, polyvinyl alcohol, polyvinyl pyrrolidone, or polyuronic acids; or many other water-soluble polymers of synthetic or natural origin. These substances can be used alone or in combination with one another.

The light sensitive component of layer 3 can be any light sensitive, high molecular weight azo compound or water soluble chromate capable of tanning a colloid on exposure to light. These azo compounds when incorporated in a water soluble colloid have the property that when the composition is exposed to light, the light exposed portion will remain firmly bonded to the underlying layer 2 when contacted with water, whereas the non-light exposed portions when contacted with water are readily removed. This is likewise true of the water soluble dichromates such as potassium, sodium and ammonium dichromate. Thus these materials when used in an insolubilizing amount with the colloid allow the production of raised characters or designs and give a plate suitable for intaglio or typographic printing. However, in order to produce the preferred autopositive photolithographic plates, the light sensitive compound is used with the colloid only in such proportions that on exposure to light the light exposed portions will be rendered water insoluble and yet remain hydrophilic, the non-light exposed portions, of course, remaining water soluble. Examples of suitable proportions for accomplishing this preferred result will be hereinafter given in this specification.

Suitable light sensitive azo compounds include the diazonium compounds, diazo sulfonates, diazo amino compounds and azido compounds, such compounds having a high molecular weight of at least 225.

As azo compounds suitable for the new process there can be used compounds of the following general formula:

$$R—Y—Ar—N_2—X$$

wherein R means an aryl, aralkyl, a higher alkyl or an aroyl residue, Y means O, S, NH or $NR_1$, $R_1$ standing for alkyl, aralkyl or aryl, Ar means an aromatic residue, and X is nitrogen or an equivalent of an anion of an acid.

Under the term "aroyl" we mean the acyl radicals of aromatic carboxylic acids, e.g. benzoyl, and the expression "equivalent of an anion of an acid" designates radicals such as $Cl^-$, $SO_4{=}/2$, $ZnCl_4{=}/2$, $C_6H_5SO_3^-$, and the like.

The substituent Y and the diazo group $N_2$ are preferably in a para-position to each other. The aromatic residue Ar, the group R and the NH-group can contain further substituents. In most cases it is advantageous that the residues R and Ar are substituted by alkoxy, aroxy or N-aryl-sulfamido groups or by one or more halogen atoms. When using a diazo compound of the formula

```
R
|
N—Ar—N2—X
|
R1
```

as above defined the substituents R and $R_1$ can be connected with one another to form a cyclic compound, or R or $R_1$ can be connected with Ar by a covalent linkage.

Particularly satisfactory results have been obtained by the use of such diazo compounds which are obtained by treating the diazo compounds mentioned above with carbonyl compounds such as formaldehyde. Thus higher condensed diazo compounds are obtained which are valuable for the new process.

Also there can be used the so-called diazo sulfonates which can be obtained by treating the diazo compounds with sulfites. Likewise we can use diazo-amino compounds which can be obtained by causing the diazo compounds in question to react with guanidine, taurine or similar compounds, though the light sensitivity of these condensation products is usually weaker than that of the before mentioned products.

In the following, there are enumerated many different azo compounds suitable for the process of this invention, without limiting the scope. There are suitable the diazonium compounds of 4-(N-benzyl-N-ethyl)-aminoaniline;
4-amino-2′-methyldiphenylamine;
4-amino-2′,5′-dibutoxydiphenylamine;
4-amino-4′-dimethylaminodiphenylamine;
4-amino-3′,6′-dibutoxydiphenylamine;
4-amino-3′,6′-dimethoxydiphenylamine;
4-(N-(4′-chlorobenzyl)-N-methyl)-aminoaniline;
4-(4′-diethylaminophenyl sulfamidoaniline;
4-amino-4′-diethylaminodiphenylether;
3-amino-4,4′-diethoxydiphenylether;
4-amino-4′-diethylaminodiphenylsulfide;
4-(N-2,6-dichlorobenzyl)-aminoaniline;
4-(N-cyclohexyl)-aminoaniline;
4-amino-2,5,4′-tribromodiphenylamine;
4-amino-2′,4′,6′-trichlorodiphenylamine;
4-amino-2-N-(2,5-diethoxyphenyl)-sulfamido - diphenylamine;
4-amino-3,6 - dimethoxydiphenylamine - 2′ - carboxylic acid;
1-amino-2,5-di-n-propoxy-4′-methyldiphenylsulfide;
N-(2,6-dichlorobenzyl)-3-amino-carbazol;
4-(N-2,3,4,6-tetrachlorobenzyl)-aminoaniline;
4-N-2,6-dichlorobenzyl,N-ethyl) - amino - 2,5-diethoxyaniline;
and 4-amino-2,5,4′-triethoxydiphenylether.

Aldehyde and particularly formaldehyde condensation products of these foregoing diazonium compounds, the derived diazosulfonates, the aldehyde condensation products of the derived diazosulfonates; and the diazoamino compounds prepared by the reaction of the foregoing diazonium compounds with amines.

Also suitable for the process of this invention are certain azido compounds of the type $$N_3—Ar—Y—Ar—N_3$$

where Y is O, S, NH, NR, —CH=CH—, —C≡C—, in which R is a lower aliphatic radical and Ar are aromatic residues on which either or both may be substituted with a water-soluble grouping such as $—NH_3X$, $—SO_3H$, —COOH, etc., in which X is the anion of an acid such as $Cl^-$, $Br^-$, $—SO_3H^-$, $\frac{1}{2}SO_4^{=}$. Examples of these compounds are:

Disodium-4,4′-diazidostilbene - 2,2′ - disulfonate; 4,4′-diazidotolane - 2,2′ - dicarboxylic acid; 4,4′ - diazidodiphenylether - 3,3′-disulfonic acid; 5,5′ - diazido-2,2′-diamino stilbenedihydrochloride sodium; 4,4′ - diazidodiphenylmethylamine-2-sulfonate.

The preferred diazonium compounds used according to this invention are the condensation products of aldehydes or ketones with aromatic diazonium compounds as disclosed and claimed in Schmidt and Zahn Patent 2,063,631. Particularly satisfactory results have been obtained with the condensation product of formaldehyde with p-diazodiphenylamine sulfate or chloride.

The optimum ratio of colloid to sensitizer to be used must be determined for each combination of colloid and sensitizer. Preferred combinations include the colloids, hydroxyethylcellulose, propylene glycol alginate, dextran (including partially hydrolyzed or degrated dextrans, and corn dextran) used in conjunction with the zinc chloride double salt of the condensation product of equimolar quantities of formaldehyde and para-diazodiphenylamine chloride or sulfate. The usable and preferred ratios of these compounds for use in layer 3 may be found in Table I.

TABLE I

| Colloid | Ratio of Colloid to Sensitizer | |
|---|---|---|
| | Usable | Preferred |
| Hydroxyethylcellulose | 20:1–110:1 | 40:1–80:1 |
| Propylene glycol alginate | 1:1–100:1 | 5:1–50:1 |
| Dextrans | 1:1–100:1 | 5:1–50:1 |

The operable ratios in the foregoing table apply approximately to all condensation products of aldehydes with diazonium compounds. The operable ratios for other hydrophilic colloid and other tanning agents can be readily determined by making up samples with varying amounts of tanning agent, coating on a suitable substrate and drying to produce a film, exposure to light sufficient to produce insolubilization of the colloid in water or other aqueous solution, and the mixing of said water or aqueous solution with a petroleum oil, and applying to the colloid to determine whether the insoluble colloid is hydrophilic.

The photosensitive layer 3 is preferably coated from a water solution of the colloid and tanning agents. In addition to these components, other materials may be added, such as stabilizers of colloid or sensitizer, materials which improve the flexibility of the coated film, colored materials to improve the appearance of the film, wetting agents to improve the coatability of the film, or any other compatible materials for some specific purpose. For example, if a diazosulfonate is used as the sensitizing component, a coupler such as phloroglucinol or 1-phenyl-3-carbethoxy-5-pyrazolone can be incorporated so that the light activated diazosulfonate will react with the coupler to form a colored azo dye in the exposed areas, thus providing a visible image on the exposed plates.

In coating the sensitizing layer, the coating solution is maintained at an acidic pH if diazonium compounds are used, in order that the diazonium compound will remain stable for a longer period.

When ready to use, the plate is exposed to a suitable light source through a transparent or translucent pattern in close contact with the plate, as in a vacuum frame. The exposure time varies with the light source, the components used in the plates, the density of the pattern used, but can be determined readily by a simple test. After exposure to light and removal of the pattern, the plate is swabbed with a cotton pad or cellulose sponge soaked with water or a suitable aqueous solution. The plate is now ready for use on a typical lithographic printing press. It will produce direct positive copies of the pattern used in the exposure.

The water wash may be omitted and the plate may be placed on the press ready to use, if the press is located in subdued light. The normal swabbing of the plate with lithographic fountain solution, as is done by those skilled in the art, will then accomplish the desensitizing.

If a visible image is desired on the exposed plate before it is used on a lithographic press, an image may be readily formed by swabbing the washed plates, while still wet, with an oily or greasy material containing a colored dye or pigment, such as typical lithographic ink.

The following examples illustrate the invention:

*Example 1*

An aqueous solution containing 4% hydroxyethylcellulose (e.g. Cellosize WSLH produced by Carbide and Carbon Chemicals Corporation), 0.15% of the condensation product of formaldehyde and p-diazodiphenylamine sulfate, 0.075% zinc chloride, and 0.004% sodium hexylbenzene sulfonate was coated on a surface consisting of the light decomposition product of the aforementioned diazonium condensation product supported on a sheet of clay coated paper. After drying, the coated sheet was exposed to light, f.i. to a 35 ampere carbon arc lamp at a distance of 60 inches for 1 minute through a photographic positive. The exposed plate was then swabbed with water by means of a cotton pad and used on a typical offset lithographic press (for example, the Dittolith Model L-10 produced by Ditto, Incorporated, of Chicago, Illinois) to produce positive copies of the original pattern.

*Example 2*

An aqueous solution containing 5% dextran, 0.25% of the zinc chloride double salt of the condensation product of formaldehyde and p-diazodiphenylamine chloride, and .006% sodium dodecylbenzene sulfonate was coated on the surface designated in Example 1 and dried. Subsequent treatment was as in Example 1.

*Example 3*

An aqueous solution containing 2.0% propylene glycol alginate, 0.20% of the diazonium condensation product cited in Example 2 and 0.005% of sodium lauryl sulfate was coated on a surface consisting of the light decomposition product of the diazonium compound cited in Example 2 supported on and in a film of regenerated cellulose. After drying, the sensitized sheet was treated and used further as in Example 1.

*Example 4*

A water receptive surface was prepared by treating a sheet of aluminum foil (0.005 inch in thickness) in a 2.2% aqueous solution of acidic salts of chromic acid (preferably Iridite #14 produced by Allied Research Products Corporation of Baltimore, Md.) at a temperature of 20–30° C. for 3–4 minutes. After rinsing the plate with water and drying, this hydrophilic surface was coated with an aqueous solution containing 1.0% of the condensation product of formaldehyde and p-diazodiphenylamine sulfate, and 0.03% sodium hexylbenzene sulfonate. After drying, this surface was exposed to a bright source of light such as a 1200 watt pressurized mercury arc lamp at a distance of 14 inches for a period of 30 seconds.

On this surface was coated an aqueous solution containing 5.0% dextran and 1.0% ammonium bichromate. After this coating was dried, the plate was stored for three months and was used as in Example 1.

*Example 5*

A sheet of cellulose triacetate laminated to a sheet of aluminum foil was superficially saponified. This plate after washing and drying was then coated with a 2% solution of the condensation product of formaldehyde and p-diazodiphenyl ether sulfate. After complete exposure of the plate to the arc light, as described in Example 4, the plate was coated with an aqueous solution containing 1% polyvinylpyrrolidone, 1% polyvinyl alcohol and 0.1% of the above diazonium condensation product.

After drying the plate was stored until ready for use. It was then exposed through a positive half-tone photographic transparency to a 35 amp. carbon arc lamp at a distance of 60 inches for a period of sixty seconds. After exposure, the plate was washed with a cotton pad soaked in water. The plate was then placed on a typical offset lithographic press and was used to print replicate copies of the positive original.

*Example 6*

A sheet of paper treated with melamine-formaldehyde resin to give it high wet strength and weighing about twenty pounds per thousand square feet was coated on the surface with a solution of stearatto chromic chloride ("Quilon" prepared by E. I. du Pont de Nemours and Company). After drying, this sheet was coated with the solution designated in Example 2. After drying this coating, the plate was exposed and used further as in Example 1.

*Example 7*

A sheet of cellulose acetate butyrate, superficially saponified on one surface to render it water receptive, was coated on this surface with a 3% solution of the diazo-sulfonate prepared by treating, in aqueous solution, the condensation product of formaldehyde and para-diazodiphenylamine sulfate with an equimolor portion of sodium sulfite. This coating was dried and was then exposed to sufficient light to decompose the diazosulfonate and render it oleophilic. This surface was then coated with an aqueous solution containing 1% dextran, 1% dextrin, 0.03% phosphoric acid, and 0.03% of the diazosulfonate previously used. This plate was then thoroughly dried and stored until ready for use.

The plate was then exposed through a positive halftone photographic transparency to a 35-amp. carbon arc lamp at a distance of sixty inches for a period of sixty seconds. After exposure, the plate was washed with a cellulose sponge soaked in water. The plate was then placed on a typical offset lithographic press and was used to print replicate copies of the positive original.

While we have described certain preferred embodiments of our invention, many modifications thereof may be made without departing from the spirit of the invention; we do not wish to be limited to the detailed examples, formulas, and proportions of ingredients herein set forth but desire to avail ourselves of all changes within the scope of the appended claims.

We claim:

1. A photosensitive plate suitable for the manufacture of printing plates comprising a base sheet having an oleophilic surface comprising a substantial amount of the water insoluble light decomposition product of a diazonium compound having a molecular weight of at least 225, and having a layer thereon of a hydrophilic water soluble hydroxy ethyl cellulose, having uniformly dispersed throughout a substantial amount of a light sensitive diazonium compound having a molecular weight of at least 225, the ratio of hydroxy ethyl cellulose to light sensitive diazonium compound being between 20:1 and 110:1.

2. A photosensitive plate suitable for the manufacture of an auto positive photolithographic printing plate, comprising a base sheet with an oleophilic surface consisting essentially of a water-insoluble composition selected from the group consisting of water-insoluble decomposition products of azo compounds having a molecular weight of at least 225, azo tanned colloids and chromate tanned colloids and having a layer thereon of water soluble hydroxy ethyl cellulose containing a water soluble salt of the condensation product of an aldehyde and a diazonium compound in the ratio of hydroxy ethyl cellulose to diazonium compound of between 20:1 and 110:1.

3. A photosensitive coated sheet suitable for use for printing plates which comprises a base sheet having a surface layer consisting essentially of the water insoluble light decomposition product of the condensation product of a formaldehyde and a para-diazodiphenylamine, and having a layer thereon consisting essentially of hydroxy ethyl cellulose and the water soluble condensation product of a formaldehyde and a para-diazodiphenylamine, the ratio of hydroxy ethyl cellulose to the said water soluble condensation product being between 40:1 and 80:1.

4. The process of preparing a photolithographic plate which comprises exposing the hydrophilic surface of the plate of claim 2 to light through a pattern having relatively transparent and opaque portions corresponding to a positive image for a sufficient time and intensity of light to render the light exposed portions water insoluble without becoming hydrophobic, and contacting the said surface with water to dissolve the unexposed surface portions down to the surface of the oleophilic layer.

5. The process of preparing an auto positive photolithographic plate for use in offset printing which comprises exposing the sensitized hydroxy ethyl cellulose surface of the plate of claim 3 to light through a photographic positive for a time and at an intensity sufficient to render the light exposed portions of the sensitized hydroxyethyl cellulose water insoluble while remaining relatively hydrophilic as compared to the relatively hydrophobic underlying surface of water insoluble light decomposition product, and contacting the unexposed surface with water to dissolve the unexposed surface portions down to the surface of the said water insoluble hydrophobic layer.

References Cited in the file of this patent

UNITED STATES PATENTS

| | | |
|---|---|---|
| 1,265,641 | Foerster | May 7, 1918 |
| 1,759,956 | Reed et al. | May 27, 1930 |
| 2,100,063 | Zahn | Nov. 23, 1937 |
| 2,230,981 | Toland et al. | Feb. 4, 1941 |
| 2,309,027 | Toland et al. | Jan. 19, 1943 |
| 2,448,861 | Colt | Sept. 7, 1948 |
| 2,474,700 | Slifkin | June 28, 1949 |
| 2,679,489 | Seven et al. | May 25, 1954 |
| 2,702,243 | Schmidt | Feb. 15, 1955 |

OTHER REFERENCES

Chemistry of Lithography; copyright 1952; pub. by Lithographic Technical Foundation, Inc., New York, pages 135 and 136. (Copy in Scientific Library.)

Tory: Photography; publishers, Associated General Publications; page 148; July 1953. (Copy in Science Library.)